United States Patent
Guo et al.

(10) Patent No.: US 9,859,436 B2
(45) Date of Patent: Jan. 2, 2018

(54) MANUFACTURE METHOD OF TFT SUBSTRATE STRUCTURE AND TFT SUBSTRATE STRUCTURE

(71) Applicant: Wuhan China Star Optoelectronics Technology Co., Ltd., Wuhan (CN)

(72) Inventors: Wenshuai Guo, Wuhan (CN); Xing Ming, Wuhan (CN); Zhiyuan Shen, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 234 days.

(21) Appl. No.: 14/778,607

(22) PCT Filed: Jun. 24, 2015

(86) PCT No.: PCT/CN2015/082168
§ 371 (c)(1),
(2) Date: Sep. 20, 2015

(87) PCT Pub. No.: WO2016/197406
PCT Pub. Date: Dec. 15, 2016

(65) Prior Publication Data
US 2017/0222061 A1    Aug. 3, 2017

(30) Foreign Application Priority Data
Jun. 9, 2015    (CN) .......................... 2015 1 0312477

(51) Int. Cl.
*H01L 29/786* (2006.01)
*H01L 29/423* (2006.01)
(Continued)

(52) U.S. Cl.
CPC .... *H01L 29/78675* (2013.01); *H01L 27/1222* (2013.01); *H01L 27/1288* (2013.01);
(Continued)

(58) Field of Classification Search
CPC ......... H01L 29/78645; G02F 1/136213; G02F 1/136227; G02F 2001/136231; G02F 2001/136236
(Continued)

(56) References Cited

U.S. PATENT DOCUMENTS 6,384,427 B1 * 5/2002 Yamazaki ......... H01L 29/78621
257/59
6,580,094 B1 * 6/2003 Yamazaki ............ G09G 3/3275
257/344

(Continued)

FOREIGN PATENT DOCUMENTS

CN    10294890 A    9/2011

*Primary Examiner* — Jonathan Han
(74) *Attorney, Agent, or Firm* — Leong C. Lei

(57) ABSTRACT

The present invention provides a manufacture method of a TFT substrate structure and a TFT substrate structure. In the manufacture method of the TFT substrate structure, as manufacturing the gate, a plurality of metal sections distributed in spaces are formed at two sides of the gate, and the gate and the plurality of metal sections are employed to be a mask to implement ion implantation to the polysilicon layer. In the TFT substrate structure according to the present invention, the undoped areas are formed among the n-type heavy doping areas while forming the n-type heavy doping areas at the polysilicon layer.

11 Claims, 6 Drawing Sheets

(51) Int. Cl.
H01L 27/12 (2006.01)
H01L 29/66 (2006.01)

(52) U.S. Cl.
CPC .. H01L 29/42384 (2013.01); H01L 29/66757 (2013.01); H01L 29/78696 (2013.01)

(58) Field of Classification Search
USPC .................. 257/E27.111, E29.275; 438/283
See application file for complete search history.

(56) References Cited

U.S. PATENT DOCUMENTS

| | | | |
|---|---|---|---|
| 2002/0125535 A1* | 9/2002 | Ueda ................ | H01L 29/66757 257/347 |
| 2007/0001225 A1* | 1/2007 | Ohnuma ............ | H01L 27/1214 257/347 |
| 2009/0261337 A1* | 10/2009 | Sakakura ................ | H01L 27/12 257/72 |
| 2011/0220878 A1* | 9/2011 | Lee .................... | H01L 29/78645 257/40 |
| 2012/0069259 A1* | 3/2012 | Oh ...................... | H01L 27/1214 349/43 |
| 2012/0146038 A1* | 6/2012 | Kitakado ............ | H01L 27/1214 257/59 |

* cited by examiner

MANUFACTURE METHOD OF TFT SUBSTRATE STRUCTURE AND TFT SUBSTRATE STRUCTURE

FIELD OF THE INVENTION

The present invention relates to a display technology field, and more particularly to a manufacture method of a TFT substrate structure and a TFT substrate structure.

BACKGROUND OF THE INVENTION

The LCD (Liquid Crystal Display) possesses many advantages of being ultra thin, power saved and radiation free. It has been widely utilized in, such as mobile phones, Personal Digital Assistant (PDAs), digital cameras, laptop screens or notebook screens.

Generally, the liquid crystal display comprises a shell, a LCD panel located in the shell and a backlight module located in the shell. Particularly, the structure of the liquid crystal panel mainly comprise a TFT Array Substrate (Thin Film Transistor Array Substrate), a CF (Color Filter) and a Liquid Crystal Layer. The working principle is that the light of backlight module is reflected to generate images by applying driving voltages to the two glass substrate for controlling the rotations of the liquid crystal molecules.

With the mobile display technology has been playing a significant role in the application of life, the development direction of the mobile display technology goes for higher display quality, high precision degree, thinner and lower power consumption. The size of the element is demanded to be smaller and smaller. The electric field strength in local area inside the element is also enhanced thereby, and particularly, a strong electrical field exists around the drain. Under the action of the strong electrical field, the carrier gains higher energy and becomes hot carrier. The influence of the hot carrier to the element property shows in the following two aspects:

(1) the hot carrier crossing the isolation layer is implanted into the oxide layer and accumulates constantly to change the threshold voltage, and thus affect the element lifetime.

(2) in the depletion region around the drain, new electron hole pairs are generated due to the collision with the crystal lattice. The Metal Oxide Semiconductor (MOS) field effect transistor is illustrated, the electrons generated by collision form the additional leakage electrical current, and holes are collected by the substrate to form the substrate current. The total current becomes a sum of saturated drain current and substrate current. The hot carrier effect is one of the fundamental factors restricting the highest working voltage of the element.

For solving the influence of the appearance of the hot carrier effect to the element property, the technical staff figures out kinds of methods to avoid the generation of the strong electrical field. Please refer to FIG. 1, which is a diagram of a TFT substrate structure according to prior art. The TFT substrate structure comprises a substrate 100, a semiconductor layer 200 positioned on the substrate 100, a source/a drain 300 positioned on the semiconductor layer 200, an insulative layer 400 positioned on the source/the drain 300 and the semiconductor layer 200, and a gate 500 positioned on the insulative layer 400. Specifically, the semiconductor layer 200 comprises a channel area 210 under the gate 500 correspondingly, two n-type heavy doping areas 220 at two sides of the channel area 210 and contacting with the source/the drain 300, and two off set areas 230 among the two n-type heavy doping areas 220 and the channel area 210. Because the offset areas 230 are not doped, and the resistance value is higher, it can disperse the strong electrical field around the electrode to avoid the generation of the hot carriers. However, the leakage current of such kind of TFT substrate structure becomes smaller, and the working current correspondingly becomes smaller, either. It results in the increased power consumption.

SUMMARY OF THE INVENTION

An objective of the present invention is to provide a manufacture method of a TFT substrate structure, capable of forming the undoped areas among the n-type heavy doping areas while forming the n-type heavy doping areas at the polysilicon layer for increasing the resistance value and dispersing the strong electrical field around the electrode to avoid the influence of hot carrier effect to the element property due to the existence of the local strong electrical field and to raise the working current.

Another objective of the present invention is to provide a TFT structure, of which the undoped areas are formed among the n-type heavy doping areas of the polysilicon layer to avoid the generation of the strong electrical field and eliminating the influence of hot carrier effect to the element property and to raise the working current.

For realizing the aforesaid objectives, the present invention is to provide a manufacture method of a TFT substrate structure, comprising steps of:

step 1, providing a substrate and deposing a buffer layer on the substrate;

step 2, deposing a polysilicon layer on the buffer layer;

step 3, deposing a gate isolation layer on the polysilicon layer, and deposing a metal layer on the gate isolation layer;

step 4, coating a photoresist layer on the metal layer, and implementing patterning process to the photoresist layer with one mask to acquire a first photoresist section in the middle and a plurality of second photoresist sections which are distributed in spaces at two sides of the first photoresist section;

step 5, employing the first photoresist section and the plurality of second photoresist sections to be a mask to implement etching to the metal layer to acquire a gate under the first photoresist section correspondingly and to respectively acquire a plurality of metal sections under the plurality of second photoresist sections correspondingly;

step 6, stripping the first photoresist section and the plurality of second photoresist sections, and employing the gate and the plurality of metal sections to be a mask to implement ion implantation to the polysilicon layer to form a channel area at the polysilicon layer under the gate correspondingly, and to form a plurality of n-type heavy doping areas at two sides of the channel area correspondingly, and to form a plurality of undoped areas among the plurality of n-type heavy doping areas under the plurality of metal sections correspondingly.

The step 4 utilizes a single slit mask, a half tone mask or a gray tone mask to acquire the first photoresist section and the plurality of second photoresist sections.

Both distances between the two second photoresist sections close to the two sides of the first photoresist section and the first photoresist section are smaller than 1 μm, and a width of the second photoresist section is 1 μm-2 μm.

The step 5 utilizes dry etching or wet etching to acquire the gate and the plurality of metal sections.

Both distances between the two metal sections close to the two sides of the gate and the gate are smaller than 1 μm, and a width of the metal section is 1 μm-2 μm.

Material of the buffer layer and the gate isolation layer is Silicon Oxide, Silicon Nitride, or a combination of the two.

Material of the metal layer is a stack combination of one or more of molybdenum, titanium, aluminum and copper.

The present invention further provides a manufacture method of a TFT substrate structure, comprising steps of:

step 1, providing a substrate and deposing a buffer layer on the substrate;

step 2, deposing a polysilicon layer on the buffer layer;

step 3, deposing a gate isolation layer on the polysilicon layer, and deposing a metal layer on the gate isolation layer;

step 4, coating a photoresist layer on the metal layer, and implementing patterning process to the photoresist layer with one mask to acquire a first photoresist section in the middle and a plurality of second photoresist sections which are distributed in spaces at two sides of the first photoresist section;

step 5, employing the first photoresist section and the plurality of second photoresist sections to be a mask to implement etching to the metal layer to acquire a gate under the first photoresist section correspondingly and to respectively acquire a plurality of metal sections under the plurality of second photoresist sections correspondingly;

step 6, stripping the first photoresist section and the plurality of second photoresist sections, and employing the gate and the plurality of metal sections to be a mask to implement ion implantation to the polysilicon layer to form a channel area at the polysilicon layer under the gate correspondingly, and to form a plurality of n-type heavy doping areas at two sides of the channel area correspondingly, and to form a plurality of undoped areas among the plurality of n-type heavy doping areas under the plurality of metal sections correspondingly;

wherein the step 4 utilizes a single slit mask, a half tone mask or a gray tone mask to acquire the first photoresist section and the plurality of second photoresist sections;

wherein both distances between the two second photoresist sections close to the two sides of the first photoresist section and the first photoresist section are smaller than 1 μm, and a width of the second photoresist section is 1 μm-2 μm;

wherein the step 5 utilizes dry etching or wet etching to acquire the gate and the plurality of metal sections.

The present invention further provides a TFT substrate structure, comprising a substrate, a buffer layer positioned on the substrate, a polysilicon layer positioned on the buffer layer, a gate isolation layer positioned on the polysilicon layer, a gate positioned on the gate isolation layer, and a plurality of metal sections positioned on the gate isolation layer; the plurality of metal sections are distributed in spaces at two sides of the gate;

the polysilicon layer comprises a channel area under the gate correspondingly, a plurality of n-type heavy doping areas at two sides of the channel area, and a plurality of undoped areas among the plurality of n-type heavy doping areas; the plurality of undoped areas are under the plurality of metal sections correspondingly.

Both distances between the two metal sections close to the two sides of the gate and the gate are smaller than 1 μm, and a width of the metal section is 1 μm-2 μm.

Material of the buffer layer, and the gate isolation layer is Silicon Oxide, Silicon Nitride or a combination of the two; material of the gate, and the plurality of metal sections is a stack combination of one or more of molybdenum, titanium, aluminum and copper.

The benefits of the present invention are: in the manufacture method of the TFT substrate structure, as manufacturing the gate, a plurality of metal sections distributed in spaces are formed at two sides of the gate, and the gate and the plurality of metal sections are employed to be a mask to implement ion implantation to the polysilicon layer. The undoped areas are formed among the n-type heavy doping areas while forming the n-type heavy doping areas at the polysilicon layer to increase the resistance value and disperse the strong electrical field around the electrode to avoid the influence of hot carrier effect to the element property due to the existence of the local strong electrical field and to raise the working current for simplifying the manufacture process, reducing the manufacture cost and diminishing the size of the TFT substrate. In the TFT substrate structure according to the present invention, the undoped areas are formed among the n-type heavy doping areas to avoid the generation of the strong electrical field and eliminate the influence of hot carrier effect to the element property for possessing higher working current. The structure is simple and the production cost is low.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
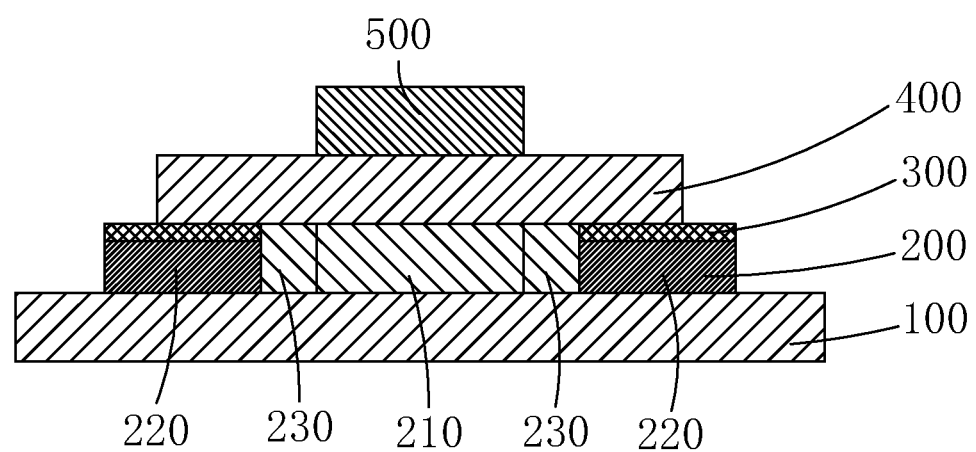
FIG. 1 is a diagram of a TFT substrate structure according to prior art.
Figure 2:
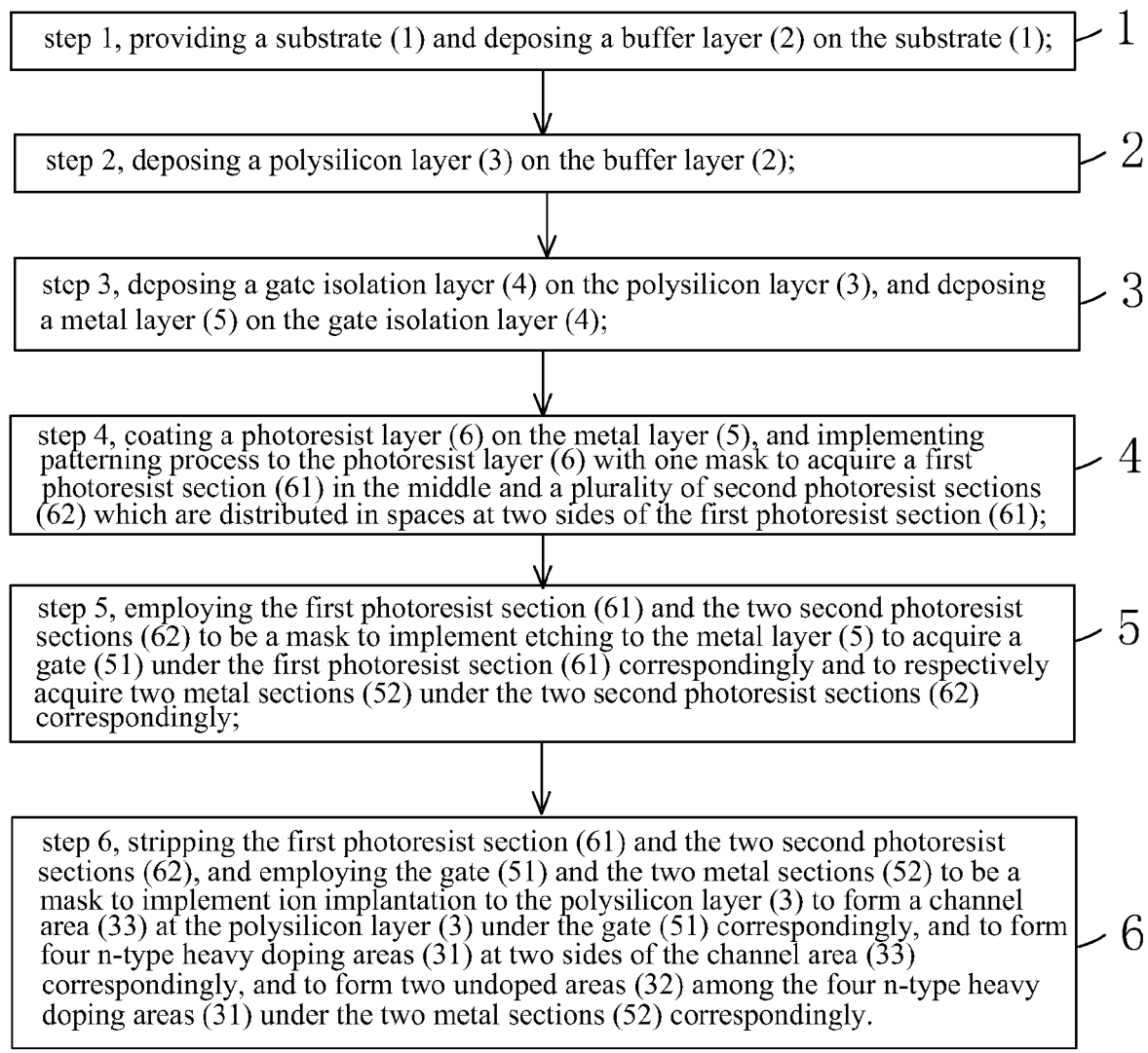
FIG. 2 is a flowchart of a manufacture method of a TFT substrate structure according to the present invention.
Figure 3:
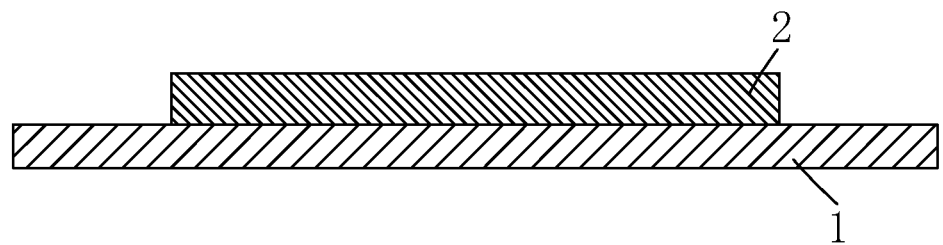
FIG. 3 is a diagram of the step 1 in the manufacture method of the TFT substrate structure according to the present invention.

Please refer to FIG. 2. The present invention first provides a manufacture method of a TFT substrate structure, comprising steps of:

step 1, as shown in FIG. 3, providing a substrate 1 and deposing a buffer layer 2 on the substrate 1.

Figure 4:
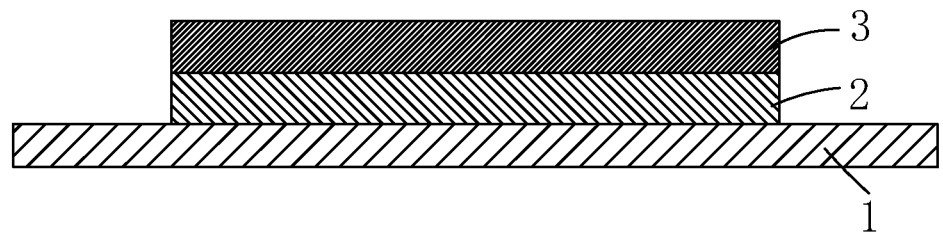
FIG. 4 is a diagram of the step 2 in the manufacture method of the TFT substrate structure according to the present invention.
Figure 5:
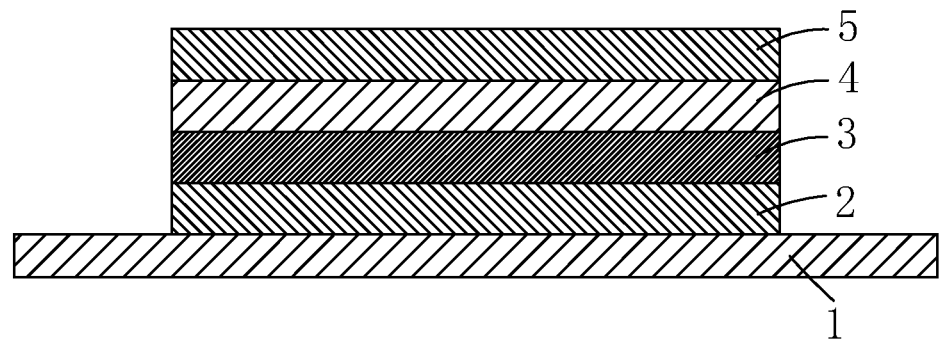
FIG. 5 is a diagram of the step 3 in the manufacture method of the TFT substrate structure according to the present invention.

Specifically, the substrate 1 can be a glass substrate or a plastic substrate. Material of the buffer layer 2 is Silicon Oxide (SiOx), Silicon Nitride (SiNx) or a combination of the two.

step 2, as shown in FIG. 4, deposing a polysilicon (Poly-Si) layer 3 on the buffer layer 2.

step 3, as shown in FIG. 5, deposing a gate isolation layer 4 on the polysilicon layer 3, and deposing a metal layer 5 on the gate isolation layer 4.

Figure 6:
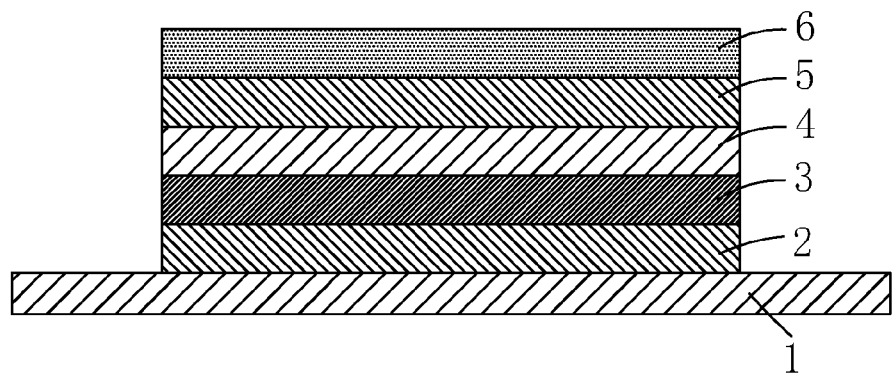
FIGS. 6-7 are diagrams of the step 4 in the manufacture method of the TFT substrate structure according to the present invention.
Figure 7:
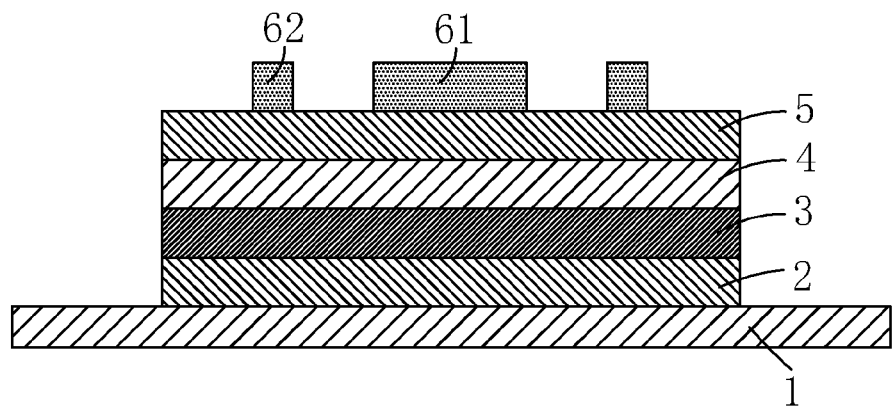

Specifically, material of the gate isolation layer 4 is Silicon Oxide, Silicon Nitride or a combination of the two. Material of the metal layer 5 can be a stack combination of one or more of molybdenum (Mo), titanium (Ti), aluminum (Al) and copper (Cu).

step 4, as shown in FIG. 6, FIG. 7, coating a photoresist layer 6 on the metal layer 5, and implementing patterning process to the photoresist layer 6 with one mask to acquire a first photoresist section 61 in the middle and a plurality of second photoresist sections 62 which are distributed in spaces at two sides of the first photoresist section 61.

Specifically, a Single Slit Mask (SSM), a Half Tone Mask (HTM) or a Gray Tone Mask (GTM) to acquire the first photoresist section 61 and the plurality of second photoresist sections 62.

Figure 8:
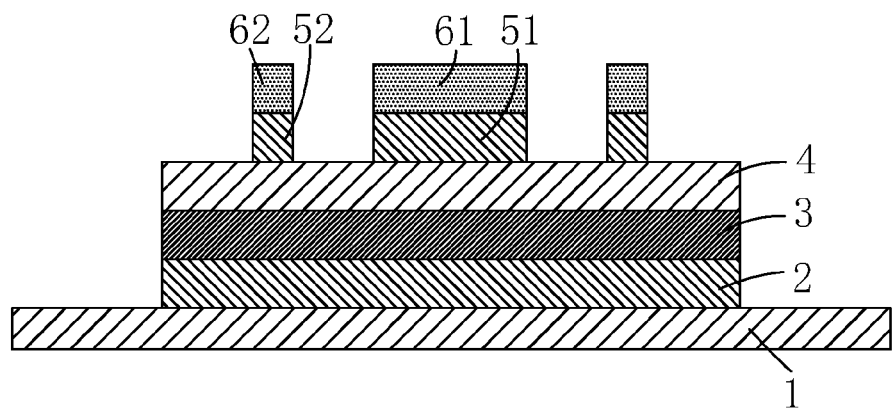
FIG. 8 is a diagram of the step 5 in the manufacture method of the TFT substrate structure according to the present invention.
Figure 9:
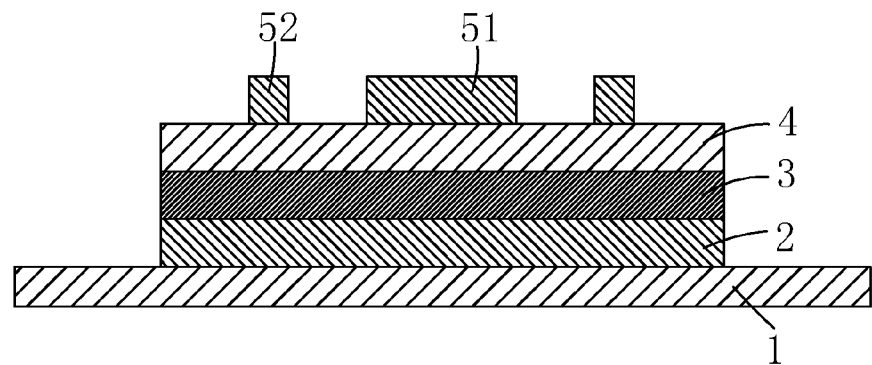
FIGS. 9-10 are diagrams of the step 6 in the manufacture method of the TFT substrate structure according to the present invention.
Figure 10:
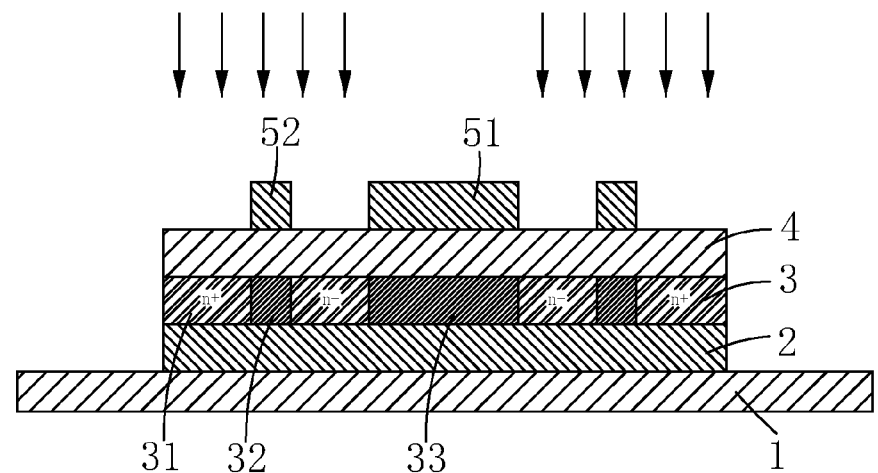

Preferably, both distances between the first photoresist section 61 and the two second photoresist sections 62 are smaller than 1 μm, and a width of the second photoresist section 62 is 1 μm-2 μm.

step 5, as shown in FIG. 8, employing the first photoresist section 61 and the two second photoresist sections 62 to be a mask to implement etching to the metal layer 5 to acquire a gate 51 under the first photoresist section 61 correspondingly and to respectively acquire two metal sections 52 under the two second photoresist sections 62 correspondingly.

Specifically, Dry Etch or Wet Etch can be utilized to acquire the gate 51 and the two metal sections 52.

Specifically, the gate 51 and the two metal sections 52 are respectively formed corresponding to the first photoresist section 61 and the two second photoresist sections 62, thus, both distances between the two metal sections 52 and the gate 51 are smaller than 1 μm, and a width of the metal section 52 is 1 μm-2 μm.

By utilizing the SSM/HTM/GTM mask, the present invention narrows down the distance between the metal section 52 and the gate 51 lower than 1 μm to diminish the size of the TFT substrate correspondingly, which is beneficial for the manufacture of small size elements.

step 6, stripping the first photoresist section 61 and the two second photoresist sections 62, and employing the gate 51 and the two metal sections 52 to be a mask to implement ion implantation to the polysilicon layer 3 to form a channel area 33 at the polysilicon layer 3 under the gate 51 correspondingly, and to form four n-type heavy doping areas (n+) 31 at two sides of the channel area 33 correspondingly, and to form two undoped areas 32 among the four n-type heavy doping areas 31 under the two metal sections 52 correspondingly. The following steps can be achieved with prior arts.

Specifically, both widths of the two n-type heavy doping areas 31 adjacent to the channel area 33 are smaller than 1 μm, and widths of the undoped areas 32 are 1 μm-2 μm.

Specifically, the range of the n-type ion concentration of the n-type heavy doping areas 31 is $10^{14}$-$10^{15}$ ions/cm$^3$.

Figure 11:
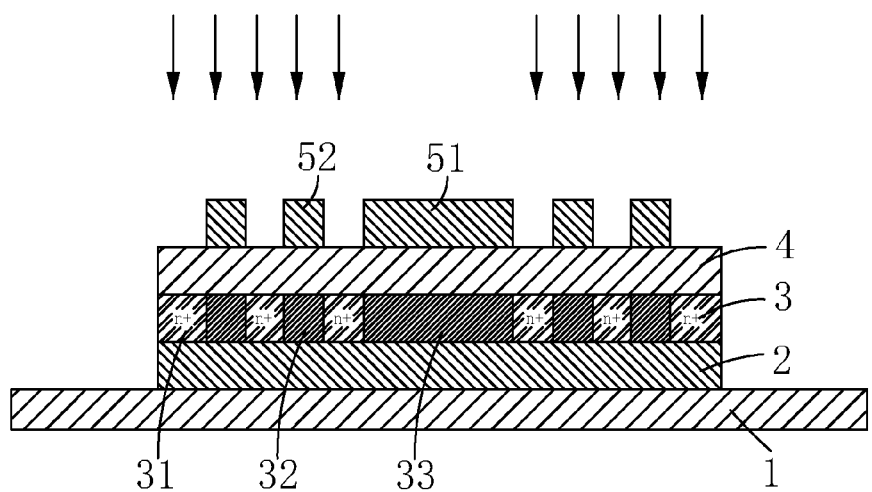
FIG. 11 is a diagram of another embodiment according to the manufacture method of the TFT substrate structure according to the present invention.

Please refer to FIG. 11, which is a diagram of another embodiment according to the manufacture method of the TFT substrate structure according to the present invention. The difference is: after implementing exposure, development to the photoresist layer, a first photoresist section in the middle and four second photoresist sections which are distributed in spaces at two sides of the first photoresist section are respectively acquired. After the etching is implemented to the metal layer, a gate 51 under the first photoresist section correspondingly is acquired and four metal sections 52 under the four second photoresist sections correspondingly are respectively acquired. After stripping the first photoresist section and the four second photoresist sections, the gate 51 and the four metal sections 52 are employed to be a mask to implement ion implantation to the polysilicon layer 3 to form six n-type heavy doping areas 31 at two sides of the channel area 33 correspondingly at the polysilicon layer 3, and to form four undoped areas 32 among the six n-type heavy doping areas 31 under the four metal sections 52 correspondingly. The rest steps are the same as the previous embodiment. The repeated description is omitted here.

Therefore, it is understandable that the amount of the second photoresist sections which are distributed in spaces at two sides of the first photoresist section is not limited by the specific restrictions according to the embodiments of the present invention. It can be two or above two; Correspondingly, the amount of the plurality of n-type heavy doping areas formed at the polysilicon layer 3 corresponding to the two side of the channel area 33 also can be adjusted on actual demands, and not restricted to specific number.

In the manufacture method of the TFT substrate structure, as manufacturing the gate, a plurality of metal sections distributed in spaces are formed at two sides of the gate, and the gate and the plurality of metal sections are employed to be a mask to implement ion implantation to the polysilicon layer. The undoped areas are formed among the n-type heavy doping areas while forming the n-type heavy doping areas at the polysilicon layer to increase the resistance value and disperse the strong electrical field around the electrode to avoid the influence of hot carrier effect to the element property due to the existence of the local strong electrical field and to raise the working current for simplifying the manufacture process, reducing the manufacture cost and diminishing the size of the TFT substrate.

Figure 12:
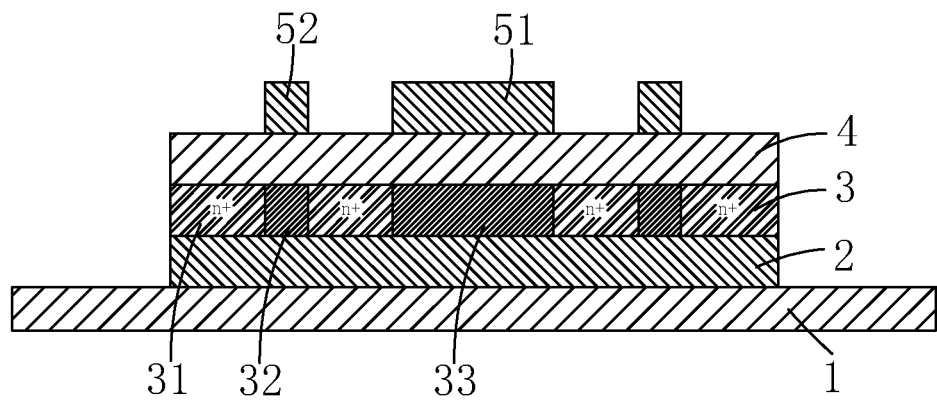
FIG. 12 is a sectional diagram of the first embodiment according to the TFT substrate structure according to the present invention.

The present invention further provides a TFT substrate structure. Please refer to FIG. 12, which is a sectional diagram of the first embodiment according to the TFT substrate structure according to the present invention. The embodiment comprises a substrate 1, a buffer layer 2 positioned on the substrate 1, a polysilicon layer 3 positioned on the buffer layer 2, a gate isolation layer 4 positioned on the polysilicon layer 3, a gate 51 positioned on the gate isolation layer 4, and two metal sections 52 positioned on the gate isolation layer 4 which are distributed in spaces at two sides of the gate 51.

The polysilicon layer 3 comprises a channel area 33 under the gate 51 correspondingly, four n-type heavy doping areas 31 at two sides of the channel area 33, and two undoped areas 32 among the four n-type heavy doping areas 31 under the two metal sections 52 correspondingly.

Preferably, both distances between the two metal sections 52 and the gate 51 are smaller than 1 μm, and a width of the metal section 52 is 1 μm-2 μm. Corresponding to this, both widths of the two n-type heavy doping areas 31 adjacent to the channel area 33 at the polysilicon layer 3 are smaller than 1 μm, and widths of the undoped areas 32 are 1 μm-2 μm.

Specifically, the range of the n-type ion concentration of the n-type heavy doping areas 31 is $10^{14}$-$10^{15}$ ions/cm$^3$.

Specifically, material of the buffer layer 2, and the gate isolation layer 4 is Silicon Oxide, Silicon Nitride or a combination of the two; material of the gate 51, and the two metal sections 52 is a stack combination of one or more of molybdenum, titanium, aluminum and copper.

Figure 13:
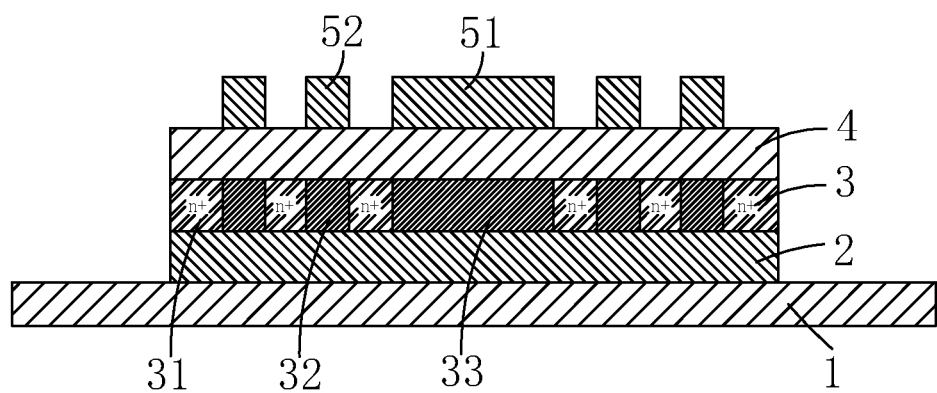
FIG. 13 is a sectional diagram of the second embodiment according to the TFT substrate structure according to the present invention.

Please refer to FIG. 13, which is a sectional diagram of the second embodiment according to the TFT substrate structure according to the present invention. The difference from the first embodiment is that four metal sections 52 are formed on the gate isolation layer 4 at two sides of the gate 51, and six n-type heavy doping areas 31 are formed at two sides of the channel area 33 correspondingly at the polysilicon layer 3, and four undoped areas 32 among the six n-type heavy doping areas 31 are formed under the four metal sections 52 correspondingly. The rest structures are the same as the first embodiment. The repeated description is omitted here.

Therefore, it is understandable that the amount of the metal sections 52 at two sides of the gate 51 on the gate isolation layer 4 is not limited by the specific restrictions according to the embodiments of the present invention. It can be two or above two; Correspondingly, the amount of the n-type heavy doping areas formed at the polysilicon layer 3 corresponding to the two side of the channel area 33 also can be adjusted on actual demands, and not restricted to specific number.

In the aforesaid TFT substrate structure, the undoped areas are formed among the n-type heavy doping areas to avoid the generation of the strong electrical field and eliminate the influence of hot carrier effect to the element property for possessing higher working current. The structure is simple and the production cost is low.

In conclusion, in the manufacture method of the TFT substrate structure, as manufacturing the gate, a plurality of metal sections distributed in spaces are formed at two sides of the gate, and the gate and the plurality of metal sections are employed to be a mask to implement ion implantation to the polysilicon layer. The undoped areas are formed among the n-type heavy doping areas while forming the n-type heavy doping areas at the polysilicon layer to increase the resistance value and disperse the strong electrical field around the electrode to avoid the influence of hot carrier effect to the element property due to the existence of the local strong electrical field and to raise the working current for simplifying the manufacture process, reducing the manufacture cost and diminishing the size of the TFT substrate. In the TFT substrate structure according to the present invention, the undoped areas are formed among the n-type heavy doping areas to avoid the generation of the strong electrical field and eliminate the influence of hot carrier effect to the element property for possessing higher working current. The structure is simple and the production cost is low.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a TFT substrate structure, comprising steps of:

step 1, providing a substrate and deposing a buffer layer on the substrate;

step 2, deposing a polysilicon layer on the buffer layer;

step 3, deposing a gate isolation layer on the polysilicon layer, and deposing a metal layer on the gate isolation layer;

step 4, coating a photoresist layer on the metal layer, which is formed in step 3 before the photoresist layer is coated, and implementing patterning process to the photoresist layer with one mask to acquire a first photoresist section in the middle and a plurality of second photoresist sections which are distributed in spaces at two sides of the first photoresist section;

step 5, employing the first photoresist section and the plurality of second photoresist sections to be a mask to implement etching to the metal layer to acquire a gate under the first photoresist section correspondingly and to respectively acquire a plurality of metal sections under the plurality of second photoresist sections correspondingly;

step 6, stripping the first photoresist section and the plurality of second photoresist sections, and employing the gate and the plurality of metal sections to be a mask to implement ion implantation to the polysilicon layer to form a channel area at the polysilicon layer under the gate correspondingly, and to form a plurality of n-type heavy doping areas at two sides of the channel area respectively positioned under the gate isolation layer where no metal sections are arranged above, and to form a plurality of undoped areas among the plurality of n-type heavy doping areas under the plurality of metal sections correspondingly, wherein the plurality of n-type heavy doping areas and plurality of undoped areas are formed while the gate and the plurality of metal sections are arranged above the gate isolation layer and utilized as the mask.

2. The manufacture method of a TFT substrate structure according to claim 1, wherein the step 4 utilizes a single slit mask, a half tone mask or a gray tone mask to acquire the first photoresist section and the plurality of second photoresist sections.

3. The manufacture method of a TFT substrate structure according to claim 1, wherein both distances between the two second photoresist sections close to the two sides of the first photoresist section and the first photoresist section are smaller than 1 μm, and a width of the second photoresist section is 1 μm-2 μm.

4. The manufacture method of a TFT substrate structure according to claim 1, wherein the step 5 utilizes dry etching or wet etching to acquire the gate and the plurality of metal sections.

5. The manufacture method of the TFT substrate structure according to claim 1, wherein both distances between the two metal sections close to the two sides of the gate and the gate are smaller than 1 μm, and a width of the metal section is 1 μm-2 μm.

6. The manufacture method of the TFT substrate structure according to claim 1, wherein material of the buffer layer and the gate isolation layer is Silicon Oxide, Silicon Nitride, or a combination of the two.

7. The manufacture method of the TFT substrate structure according to claim 1, wherein material of the metal layer is a stack combination of one or more of molybdenum, titanium, aluminum and copper.

8. A manufacture method of a TFT substrate structure, comprising steps of:

step 1, providing a substrate and deposing a buffer layer on the substrate;

step 2, deposing a polysilicon layer on the buffer layer;

step 3, depositing a gate isolation layer on the polysilicon layer, and depositing a metal layer on the gate isolation layer;

step 4, coating a photoresist layer on the metal layer, which is formed in step 3 before the photoresist layer is coated, and implementing patterning process to the photoresist layer with one mask to acquire a first photoresist section in the middle and a plurality of second photoresist sections which are distributed in spaces at two sides of the first photoresist section;

step 5, employing the first photoresist section and the plurality of second photoresist sections to be a mask to implement etching to the metal layer to acquire a gate under the first photoresist section correspondingly and to respectively acquire a plurality of metal sections under the plurality of second photoresist sections correspondingly;

step 6, stripping the first photoresist section and the plurality of second photoresist sections, and employing the gate and the plurality of metal sections to be a mask to implement ion implantation to the polysilicon layer to form a channel area at the polysilicon layer under the gate correspondingly, and to form a plurality of n-type heavy doping areas at two sides of the channel area respectively positioned under the gate isolation layer where no metal sections are arranged above, and to form a plurality of undoped areas among the plurality of n-type heavy doping areas under the plurality of metal sections correspondingly, wherein the plurality of n-type heavy doping areas and plurality of undoped areas are formed while the gate and the plurality of metal sections are arranged above the gate isolation layer and utilized as the mask;

wherein the step 4 utilizes a single slit mask, a half tone mask or a gray tone mask to acquire the first photoresist section and the plurality of second photoresist sections;

wherein both distances between the two second photoresist sections close to the two sides of the first photoresist section and the first photoresist section are smaller than 1 μm, and a width of the second photoresist section is 1 μm-2 μm;

wherein the step 5 utilizes dry etching or wet etching to acquire the gate and the plurality of metal sections.

9. The manufacture method of the TFT substrate structure according to claim 8, wherein both distances between the two metal sections close to the two sides of the gate and the gate are smaller than 1 μm, and a width of the metal section is 1 μm-2 μm.

10. The manufacture method of the TFT substrate structure according to claim 8, wherein material of the buffer layer and the gate isolation layer is Silicon Oxide, Silicon Nitride, or a combination of the two.

11. The manufacture method of the TFT substrate structure according to claim 8, wherein material of the metal layer is a stack combination of one or more of molybdenum, titanium, aluminum and copper.

\* \* \* \* \*